US012313703B2

(12) United States Patent
Englekirk (10) Patent No.: US 12,313,703 B2
(45) Date of Patent: May 27, 2025

(54) LOW-VOLTAGE FUSE READ CIRCUIT

(71) Applicant: Murata Manufacturing Co., Ltd., Kyoto (JP)

(72) Inventor: Robert Mark Englekirk, Littleton, CO (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 18/763,780

(22) Filed: Jul. 3, 2024

(65) Prior Publication Data

US 2025/0004071 A1   Jan. 2, 2025

Related U.S. Application Data

(63) Continuation of application No. 17/682,896, filed on Feb. 28, 2022, now Pat. No. 12,032,040.

(51) Int. Cl.
*G01R 31/74* (2020.01)
*H01H 85/30* (2006.01)

(52) U.S. Cl.
CPC ............. *G01R 31/74* (2020.01); *H01H 85/30* (2013.01)

(58) Field of Classification Search
CPC ....................................................... G01R 31/74
(Continued)

(56) References Cited

U.S. PATENT DOCUMENTS

| 9,709,620 B2 | 7/2017 | Englekirk |
| 12,032,040 B2 | 7/2024 | Englekirk |

(Continued)

FOREIGN PATENT DOCUMENTS

| CN | 118742965 A | 10/2024 |
| KR | 20140054142 A | 5/2014 |
| WO | 2023/164496 A1 | 8/2023 |

OTHER PUBLICATIONS

International Search Report and Written Opinion for PCT/US2023/063052 filed on Feb. 22, 2023 on behalf of Psemi Corporation Mail Date: Jun. 19, 2023 9 pages.

(Continued)

*Primary Examiner* — Tomi Skibinski
(74) *Attorney, Agent, or Firm* — Steinfl + Bruno LLP (57) ABSTRACT

Circuits and methods for reading fusible links that allows use of low-voltage logic circuitry utilizing devices that may have a high-voltage stand-off capability. Embodiments provide predictable operation that is less susceptible to PVT variations, allow the use of arrays of fuses that may be scaled to relatively large memory sizes, uses little integrated circuit area, and do not require extra pins for operation. Embodiments utilize a latch circuit and voltage dividers to generate a reference voltage $V_{REF}$ and a fuse voltage $V_{FUSE}$, and then compares and latches the greater of those voltages. The circuitry does not require any more supply voltage than is needed to turn ON input pass transistors to the latch at a slightly higher voltage ($V_{TH}$) than $V_{REF}$. Since $V_{REF}$ may be about 0.1V, that turn-ON voltage may be as low as about $0.1V+V_{TH}$, and thus would be less than a $V_{DD\_MIN}$ of about 1V.

20 Claims, 5 Drawing Sheets

(58) Field of Classification Search
USPC .......................................................... 327/525
See application file for complete search history.

(56) References Cited

U.S. PATENT DOCUMENTS

| | | | |
|---|---|---|---|
| 2005/0151578 A1* | 7/2005 | Huang | G11C 17/18 |
| | | | 327/525 |
| 2005/0280495 A1* | 12/2005 | Douzaka | G11C 29/027 |
| | | | 337/163 |
| 2010/0277999 A1 | 11/2010 | Do | |
| 2013/0170276 A1 | 7/2013 | Daigle | |
| 2023/0273271 A1 | 8/2023 | Englekirk | |

OTHER PUBLICATIONS

Razavi B. "The StrongARM Latch" *IEEE Solid-State Circuits Magazine*, vol. 7 No. 2, Spring 2015, pp. 12-17.

\* cited by examiner

LOW-VOLTAGE FUSE READ CIRCUIT

CROSS-REFERENCE TO RELATED APPLICATIONS

The present continuation application claims priority to the following patent application, assigned to the assignee of the present invention, the contents of which are incorporated by reference: U.S. patent application Ser. No. 17/682,896, filed Feb. 28, 2022, entitled "Low-Voltage Fuse Read Circuit", to issue on Jul. 9, 2024 as U.S. Pat. No. 12,032,040.

BACKGROUND

(1) Technical Field

This invention generally relates to electronic circuits, and more specifically to circuitry and methods for sensing the state of fusible link components used in such electronic circuits.

(2) Background

Fusible link technology in electronic circuits, particularly integrated circuits (ICs), has been in use for some time. Fusible links (also called just "fuses") are used for numerous purposes, such as for trimming circuit values and for storing chip IDs, serial numbers, and other non-volatile data. In particular, fuses are often used in electronic circuits to permanently or semi-permanently set values or states for other components within the circuit, such as tunable circuit elements (e.g., tunable capacitors, resistors, inductors, etc.). Some tunable circuit elements often need to be tuned only once during manufacture in order to achieve a particular design specification despite process variations and other factors that may otherwise cause circuit performance to vary from circuit to circuit. Accordingly, once such a tunable circuit element is calibrated to a desired performance level or configuration, then that static value can be embodied in a permanent or semi-permanent form using fusible links.

In general, a fuse comprises a normally conductive ("unblown") element exhibiting a relatively low resistance value (e.g., <~100Ω) for electrically interconnecting other circuit elements. However, the conductive element may be melted, disintegrated, or fractured ("blown" or "burned") by means of a pulse of electrical current and/or voltage to create an open circuit (ideally) or at least a high resistance value (e.g., >~4 kΩ).

To sense or "read" the value of a fuse, a reference resistor is typically utilized to compare against the fuse resistance: while applying a current, if the reference resistor is higher in resistance than the fuse, then the fuse was not blown, whereas if the fuse is higher in resistance than the reference resistor, then the fuse was blown. Commonly, to do a typical resistor comparison of this sort, some reference current is imposed on both the reference resistor and the fuse, and the difference ("delta") in voltage across the two devices is converted to digital logic levels ("0" or "1").

A challenge arises in reading fuse states when using low-voltage logic circuitry in applications that also require a high-voltage stand-off capability for circuit devices, particularly MOSFET devices. For example, in radio frequency (RF) switching applications (as well as in many other applications), MOSFETs may need to be fabricated with specific process characteristics in order to provide high-voltage stand-off capability (e.g., a 3.6V process), but customer applications may require low-voltage operation (e.g., a minimum supply voltage, $V_{DD\_MIN}$, of about 1V). While fuse read circuits must be able to operate on such a low supply voltage, MOSFETs having a high-voltage stand-off capability may have a threshold voltage $V_{TH}$ that may be close to (e.g., up to about 0.9V) that low $V_{DD\_MIN}$.

Accordingly, there is a need for a reliable way of reading fusible links that allows use of low-voltage logic circuitry utilizing devices that may have a high-voltage stand-off capability. The present invention addresses this need.

SUMMARY

The present invention encompasses circuits and methods for reliably reading fusible links that allows use of low-voltage logic circuitry utilizing devices that may have a high-voltage stand-off capability. Embodiments provide predictable operation that is less susceptible to process/voltage/temperature (PVT) variations, allow the use of arrays of fuses that may be scaled to relatively large memory sizes (e.g., 1024 bits), uses little integrated circuit area, and do not require extra pins for operation.

Embodiments utilize a latch circuit and a pair of voltage dividers to generate a reference voltage $V_{REF}$ and a testable fuse voltage $V_{FUSE}$, and then compares and latches the greater of those voltages. The circuitry does not require any more source supply voltage than is needed to turn ON a set of input pass transistors to the latch at a slightly higher voltage ($V_{TH}$) than $V_{REF}$. Since $V_{REF}$ may be about 0.1V, that turn-ON voltage may be as low as ~0.1V+$V_{TH}$, and thus would be less than a $V_{DD\_MIN}$ of 1V.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods for reliably reading fusible links that allows use of low-voltage logic circuitry utilizing devices that may have a high-voltage stand-off capability. Embodiments provide predictable operation that is less susceptible to process/voltage/temperature (PVT) variations, allow the use of arrays of fuses that may be scaled to relatively large memory sizes (e.g., 1024 bits), uses little integrated circuit area, and do not require extra pins for operation.

Embodiments utilize a latch circuit and a pair of voltage dividers to generate a reference voltage $V_{REF}$ and a testable fuse voltage $V_{FUSE}$, and then compares and latches the greater of those voltages. The circuitry does not require any more source supply voltage than is needed to turn ON a set of input pass transistors to the latch at a slightly higher voltage ($V_{TH}$) than $V_{REF}$. Since $V_{REF}$ may be about 0.1V, that turn-ON voltage may be as low as ~0.1V+$V_{TH}$, and thus would be less than a $V_{DD\_MIN}$ of 1V.

EXAMPLE EMBODIMENT

Figure 1:
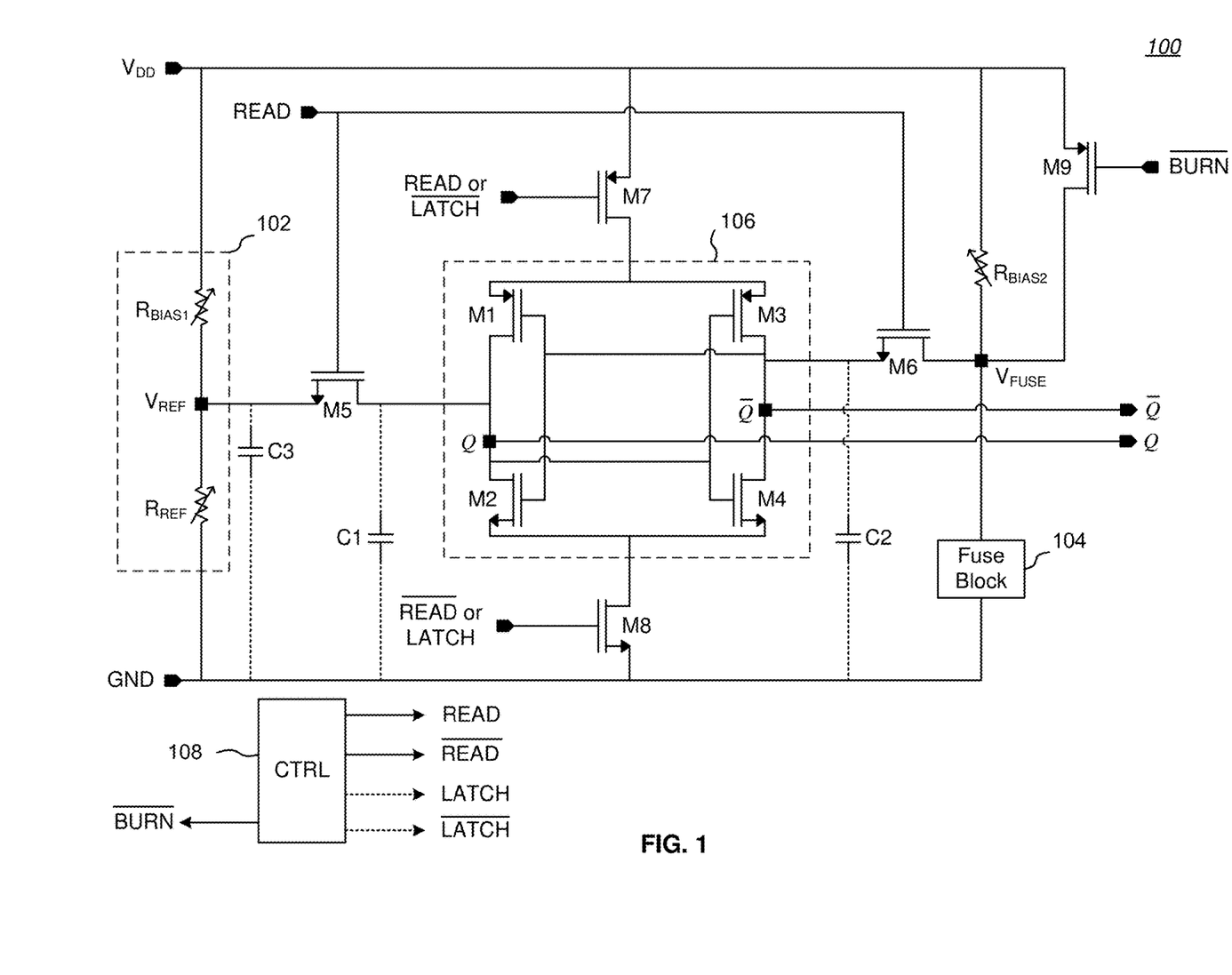
FIG. 1 is a schematic diagram of one embodiment of a fuse reading circuit in accordance with the present invention.

FIG. 1 is a schematic diagram of one embodiment of a fuse reading circuit 100 in accordance with the present invention. A supply voltage $V_{DD}$ provides power to the circuit elements, and may be, for example, as low as 1.0V (i.e., $V_{DD\_MIN} \approx 1.0V$). In the illustrated example, a voltage reference circuit 102 includes a first bias resistor $R_{BIAS1}$ and a reference resistor $R_{REF}$ coupled in series between $V_{DD}$ and a reference potential (in this example, circuit ground GND), and thus comprise a voltage divider. Both $R_{BIAS1}$ and $R_{REF}$ are shown as variable elements, but either resistor may be implemented with a fixed value. If implemented as variable devices, either or both of $R_{BIAS1}$ and $R_{REF}$ may have selectable or adjustable or programmable resistance values. The resistance values of $R_{BIAS1}$ and $R_{REF}$ determine a reference voltage $V_{REF}$ at a node between the two resistors. $V_{REF}$ is thus a function of the resistance of $R_{BIAS1}$ and $R_{REF}$; more precisely, $V_{REF} = V_{DD} \times R_{REF}/(R_{BIAS1}+R_{REF})$.

In a similar manner, a second bias resistor $R_{BIAS2}$ and a fuse block 104 are coupled in series between $V_{DD}$ and the reference potential GND, and thus comprise a voltage divider. In general, the resistance of $R_{BIAS1}$ and $R_{BIAS2}$ should be essentially identical. As described below, the fuse block 104 includes one or more individual fuses configured to be read one at a time. The resistance of $R_{BIAS2}$ and the resistance value $R_{FUSE}$ of a fuse to be read within the fuse block 104 determine a testable fuse voltage (i.e., a voltage to be tested or compared), $V_{FUSE}$, at a node between the two elements. $V_{FUSE}$ is thus a function of $R_{BIAS2}$ and the resistance of a selected fuse; more precisely, $V_{FUSE} = V_{DD} \times R_{FUSE}/(R_{BIAS2}+R_{FUSE})$.

A READ latch 106 is configured in the illustrated example as comprising (1) a first pair of transistors, PFET M1 and NFET M2, with the source-drain conduction channels of M1 and M2 coupled in series, and (2) a second pair of transistors, PFET M3 and NFET M4, with the source-drain conduction channels of M3 and M4 coupled in series. FETs M1 and M2 have gates cross-coupled to the conduction channels of the FETs M3 and M4, while FETs M3 and M4 have gates cross-coupled to the conduction channels of FETs M1 and M2.

The READ latch 106 works in combination with a comparator comprising two input pass gates, M5 and M6, and two latch disable gates, M7 and M8.

More specifically, in the example illustrated in FIG. 1, the READ latch 106 is coupled to the two input pass gates, M5 and M6, shown in this example as NFETs. M5 has its conduction channel coupled between the $V_{REF}$ node and the conduction channels of both M1 and M2. M6 has its conduction channel coupled between the $V_{FUSE}$ node and the conduction channels of both M3 and M4. The gates of M5 and M6 are coupled to a READ control signal, which may be, for example, from a suitable control circuit 108. When the READ control signal is HIGH, then the two input pass gates, M5 and M6, are ON and allow the voltages at $V_{REF}$ and $V_{FUSE}$ respectively to pass through to the READ latch 106. Conversely, when the READ control signal is LOW, then M5 and M6 are OFF and block the voltages the $V_{REF}$ and $V_{FUSE}$ from passing through to the READ latch 106.

The READ latch 106 is also coupled to the two latch disable gates, M7 and M8. M7 is a high-side latch disable gate implemented as a PFET having its conduction channel coupled between $V_{DD}$ and the conduction channels of M1 and M3. M8 is a low-side latch disable gate implemented as an NFET having its conduction channel coupled between the conduction channels of M2 and M4, and the reference potential GND. In some embodiments, the gate of M7 is coupled to the READ control signal and the gate of M8 is coupled to a $\overline{READ}$ control signal which may be, for example, from the control circuit 108. In such embodiments, the READ and the $\overline{READ}$ control signals are complementary, and generally should be non-overlapping (i.e., with deadtime between the active state of one signal and the active state of the other signal). In other embodiments, the gate of M7 is coupled to an independent $\overline{LATCH}$ control signal and the gate of M8 is coupled to a complementary LATCH control signal, both of which may be, for example, from the control circuit 108. In such embodiments, the READ and the LATCH control signals are complementary, and generally should be non-overlapping (i.e., with deadtime between the active state of one signal and the active state of the other signal). As should be clear, the control circuit 108 may output only a READ control signal, or both a READ and a LATCH control signal, and the complements may be generated by other circuitry (not shown) elsewhere, such as within the fuse reading circuit 100. An advantage of separate READ and LATCH control signals is that the timing between the control signals may be more readily adjusted as needed.

In either type of configuration, when the $\overline{READ}$ or LATCH control signal is HIGH, then the READ latch 106 is coupled between $V_{DD}$ and GND in regeneration mode (M7 is ON, M8 is ON, M5-M6 are OFF), and when the READ or $\overline{LATCH}$ control signal is HIGH, then the READ latch 106 is in acquisition (comparator and latch) mode (M7 is OFF, M8 is OFF, M5-M6 are ON).

In the illustrated example, the READ latch 106 includes two output nodes, Q and $\overline{Q}$, with Q being available between the conduction channels of both M1 and M2, and $\overline{Q}$ being available between the conduction channels of both M3 and M4, as shown. In many applications, only one of the two output nodes may be used, since the values of the two outputs should be complementary (but see below regarding a validation circuit to confirm the complementary status). Either or both outputs Q and $\overline{Q}$ may be coupled to a buffer or an inverter or the like to amplify the output signal as may be desired.

A selected fuse with the fuse block 104 may be burned by disabling the READ latch 106 (e.g., by setting the READ control signal LOW) and applying suitable power (voltage and/or current) through a transistor M9 configured to be in series with the fuse block 104 between $V_{DD}$ (or some other suitable power supply) and the reference potential (e.g., GND). Transistor M9, shown in this example as a PFET, is controlled by a $\overline{BURN}$ control signal, which may be, for example, from a conventional external control circuit (not shown). Accordingly, a burn event for a selected fuse occurs when the $\overline{BURN}$ control signal is LOW and the fuse block 104 has the selected fuse enabled.

Figure 2:
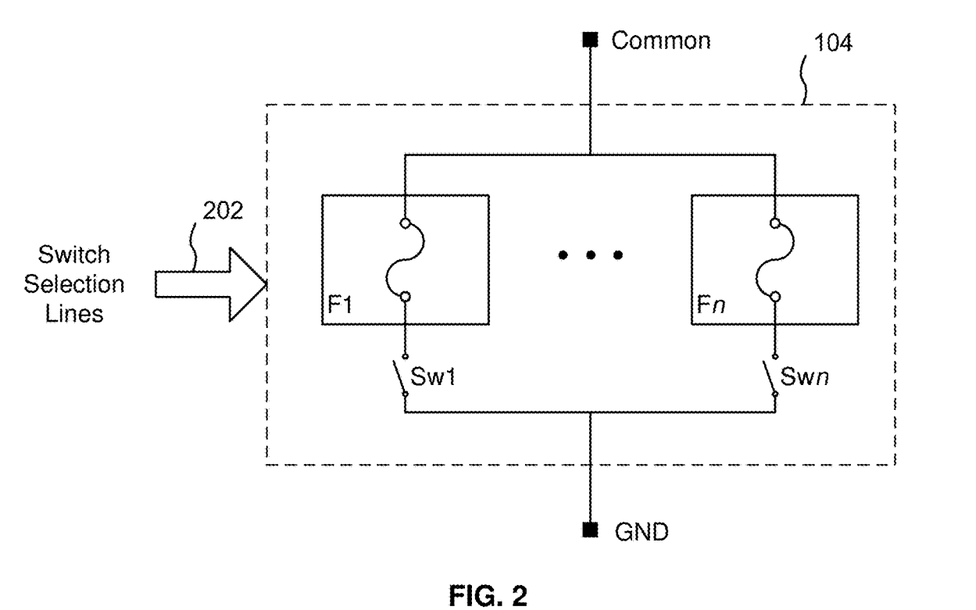
FIG. 2 is a schematic diagram of one embodiment of a fuse bank that may be used in conjunction with the fuse reading circuit of FIG. 1.

FIG. 2 is a schematic diagram of one embodiment of a fuse bank 104 that may be used in conjunction with the fuse reading circuit 100 of FIG. 1. In the illustrated example, the fuse block 104 includes n fuses F1 . . . Fn, where n≥1. When n>1, the fuses F1 . . . Fn are each coupled to a corresponding switch Sw1 . . . Swn; no switch is needed when n=1. When a fuse block 104 includes more than one fuse, switch selection lines 202 select one fuse by closing the associated switch. The switch selection lines 202 may be, for example, from the control circuit 108 shown in FIG. 1.

Referring back to FIG. 1, in general, $R_{BIAS2}$ would be configured to have a similar resistance to $R_{BIAS1}$. Accordingly, when the READ latch 106 is in acquisition mode and the READ control signal is HIGH (and thus the $\overline{READ}$ or LATCH control signal is LOW), if the resistance $R_{FUSE}$ of a selected fuse within the fuse block 104 was exactly the same as $R_{REF}$, then $V_{REF}$ would equal $V_{FUSE}$ and the inputs to the READ latch 106 through M5 and M6 would be balanced. However, the value of $R_{REF}$ is selected with the resistance values of a blown fuse versus an unblown fuse in mind, so that, preferably $V_{FUSE}$ has a significantly larger or smaller value than $V_{REF}$. For example, if $V_{DD}$=1V, then $R_{REF}$ may be selected relative to $R_{BIAS1}$ to set $V_{REF}$ at about 0.1V. When the selected fuse is unblown, and thus has a low resistance, then $V_{FUSE}$ may only be about 10% or less of $V_{REF}$ (e.g., ≤0.01V). Conversely, when the selected fuse is blown, and thus has a high resistance, then $V_{FUSE}$ may be about 190% or more of $V_{REF}$ (e.g., ≥0.2V).

Thus, when the READ latch 106 is in acquisition mode (i.e., the READ control signal is HIGH), if the resistance $R_{FUSE}$ of the selected fuse within the fuse block 104 is less than $R_{REF}$, then $V_{REF}$>>$V_{FUSE}$ and accordingly, once the READ and LATCH control signals change states, the Q output will be HIGH and the $\overline{Q}$ output will be LOW. Conversely, when the READ latch 106 is in acquisition mode, if the resistance $R_{FUSE}$ of the selected fuse within the fuse block 104 is greater than $R_{REF}$, then $V_{REF}$<<$V_{FUSE}$ and accordingly, once the READ and LATCH control signals change states, the Q output will be LOW and the $\overline{Q}$ output will be HIGH.

Of note, the example fuse reading circuit 100 does not require any more voltage at $V_{DD}$ than is needed to turn ON the two input pass gates, M5 and M6, at a slightly higher voltage ($V_{TH}$) than $V_{REF}$. Since $V_{REF}$ may be about 0.1V, that turn-ON voltage may be as low as ~0.1V+$V_{TH}$, and thus would be less than a $V_{DD\_MIN}$ of 1V. Accordingly, the illustrated fuse reading circuit 100 allows use of low-voltage logic circuitry utilizing devices that may have a high-voltage stand-off capability.

Embodiment Variations

Figure 4:
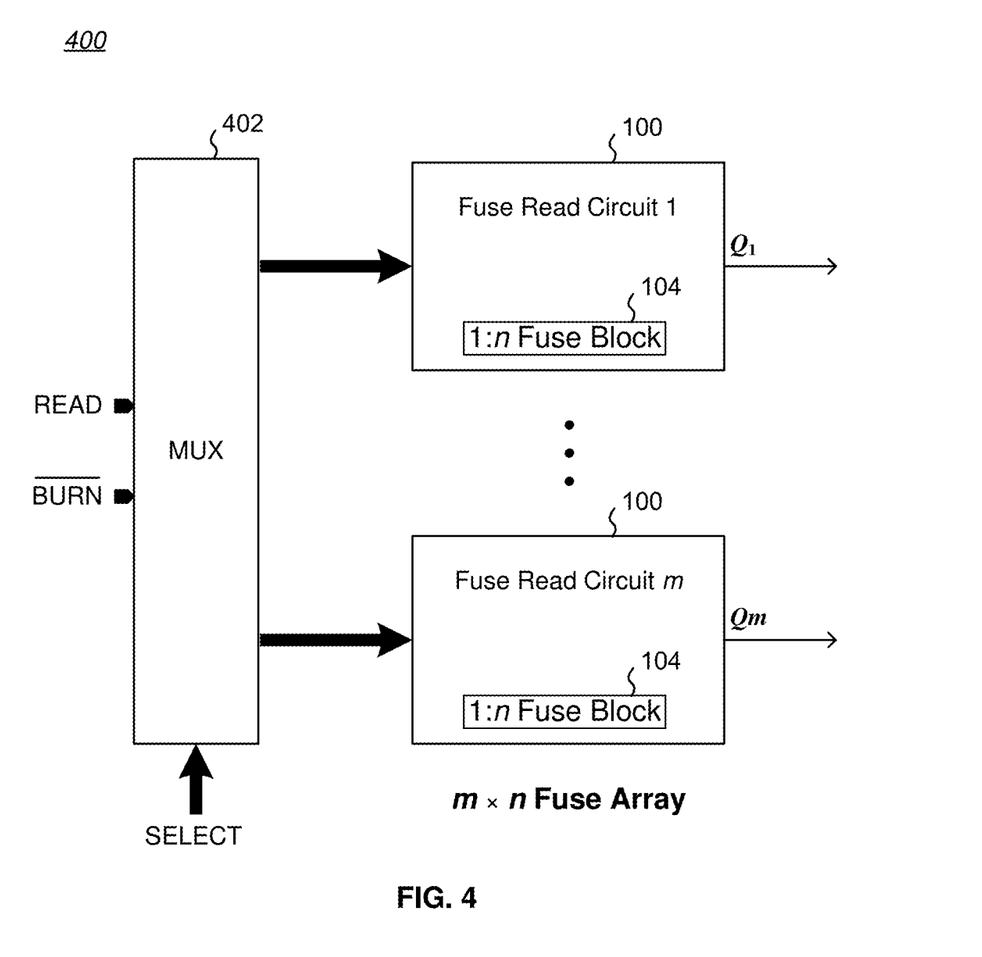
FIG. 4 is a block diagram of one embodiment of an m×n fuse array.

A useful extension of the fuse reading circuit 100 of FIG. 1 is to configure a plurality of the fuse reading circuits 100 as a fuse read block array. For example, FIG. 4 is a block diagram of one embodiment of an m×n fuse reading array 400. The fuse reading array 400 includes m fuse reading circuits 100 (where m≥2, e.g., m=32) each including a fuse block 104 of n fuses (e.g., n=32) of the type shown in FIG. 2. Thus, the number of fuses which may be selected is m×n (e.g., 32×32, or 1024). A multiplexer (MUX) 402 coupled to SELECT lines and a set of inputs allows any one fuse Fx within the fuse reading circuits 1 . . . m to be blown; however, an entire bank of fuses Fx (where x=1 . . . n) can be read at one time, with the read output appearing on corresponding outputs Q1 . . . Qm. The inputs to the MUX 402 may only be the READ and $\overline{BURN}$ control signals, since the $\overline{READ}$ control signal (and the LATCH/$\overline{LATCH}$ control signals, if used) can be generated within the MUX 402.

In variant embodiments, the $R_{REF}$ resistor may be implemented so that it can have two or more values. The at least one additional reference resistance allows for a greater margin of error between manufacturing screening and end use testing. Accordingly, the teachings of U.S. Pat. No. 9,709,620B2, issued Jul. 18, 2017, and entitled "Fuse Sense Circuit and Method", assigned to the assignee of the present invention and hereby incorporated by reference, may be adapted to embodiments of the present invention.

In some embodiments, it may be useful to include some capacitance to store charge in the latch during the READ phase (READ control signal is HIGH). For example, FIG. 1 shows optional charge storage capacitors C1 and C2 that may be coupled to the inputs of the READ latch 106 to provide charge storage during a READ phase.

In some embodiments, it may be useful to include some capacitance on the $V_{REF}$ node to reduce glitch noise. For example, FIG. 1 shows an optional capacitor C3 that may be coupled between the $V_{REF}$ node and pass gate M5.

The comparator circuitry (e.g., M5, M6, M7, and M8) and the READ latch 106 may be implemented using other types of latching circuits, including, for example, a "StrongARM" latch (see B. Razavi, "The StrongARM Latch [A Circuit for All Seasons]," in IEEE Solid-State Circuits Magazine, vol. 7, no. 2, pp. 12-17, Spring 2015, doi: 10.1109/MSSC.2015.2418155). The comparator can be clocked or just an amplifier; a clocked comparator generally would need clocking devices similar to M5-M8, while an amplifier would not need such devices.

As should be clear to one of ordinary skill in the art, if desired, the logic levels used to control the various active elements of the fuse reading circuit 100 may be inverted if complementary changes are made throughout (generally changing PFETs to NFETs and vice versa, with suitable changes to source and drain connections to power and ground).

Figure 3:
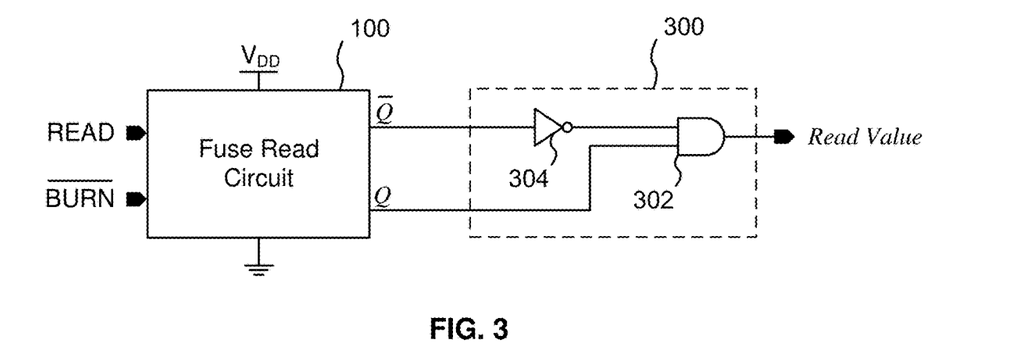
FIG. 3 is a schematic diagram of one embodiment of an output validation circuit that may be used in conjunction with a fuse reading circuit in accordance with the present invention.

In some embodiments, it may be useful to validate that the two output nodes, Q and $\overline{Q}$, are indeed in complementary states. FIG. 3 is a schematic diagram of one embodiment of an output validation circuit 300 that may be used in conjunction with a fuse reading circuit 100 in accordance with the present invention. In the illustrated example, the Q output of a fuse reading circuit 100 is coupled to a first input of an AND gate 302 (a NAND gate may also be used). The $\overline{Q}$ output of the fuse reading circuit 100 is coupled to a second input of the AND gate 302 through an inverter 304. Accordingly, if and only if Q=1 and $\overline{Q}$=0 will the output of the AND gate 302 be 1; any other input combination will result in the output of the AND gate 302 being 0. Of course, other forms of combinatorial logic may be used to validate that the output nodes are in complementary states.

While $R_{BIAS1}$ and $R_{BIAS2}$ have similar resistances in the above examples, it may be useful to scale the current and resistor values to generate $V_{REF}$. Thus, for example, there may be M bias resistors $R_{BIAS1}$ in parallel coupled in series with M reference resistors $R_{REF\_M}$ in parallel. This configuration would create a lower impedance $V_{REF}$ output, but with the same voltage as the $V_{REF}$ generated by a single $R_{BIAS1}$ resistor and a single $R_{REF}$ resistor. In addition, this configuration would allow multiple fuse reading circuits 100 (see FIG. 4) to share a $V_{REF}$ signal from a single voltage reference circuit 102 (i.e., one per fuse reading array 400), thus avoiding redundant voltage reference circuits 102 (i.e., one per fuse reading circuit 100).

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 5:
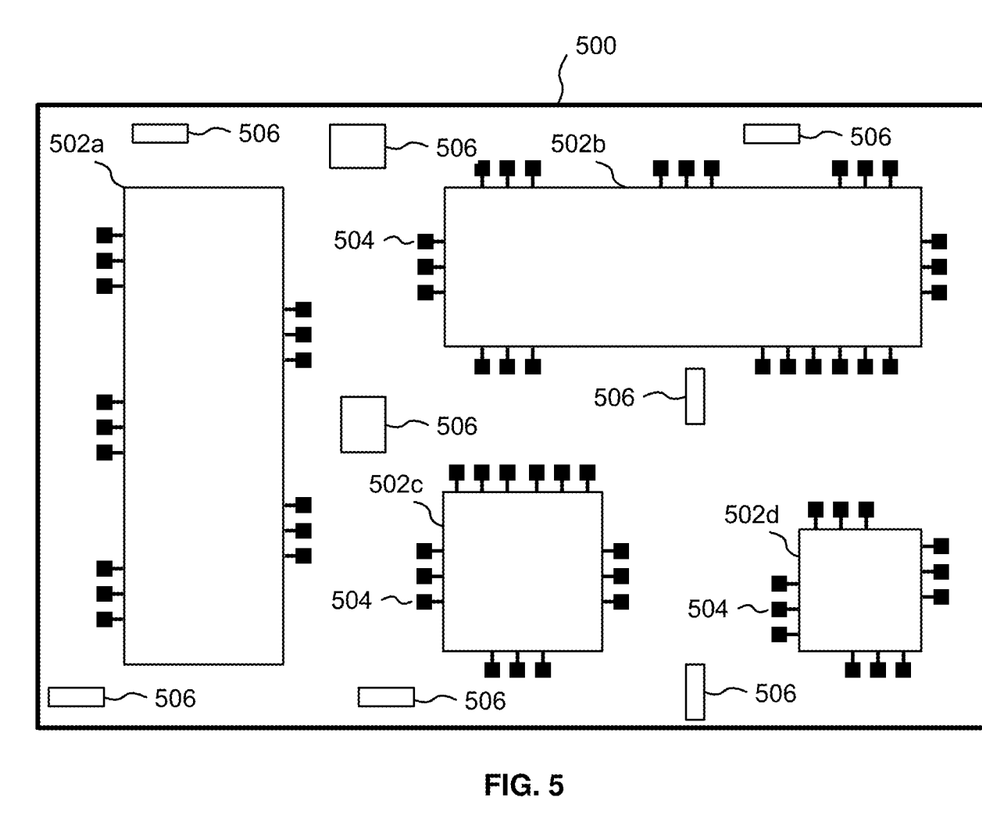
FIG. 5 is a top plan view of a substrate that may be, for example, a printed circuit board or chip module substrate (e.g., a thin-film tile).

As one example of further integration of embodiments of the present invention with other components, FIG. 5 is a top plan view of a substrate 500 that may be, for example, a printed circuit board or chip module substrate (e.g., a thin-film tile). In the illustrated example, the substrate 500 includes multiple ICs 502a-502d having terminal pads 504 which would be interconnected by conductive vias and/or traces on and/or within the substrate 500 or on the opposite (back) surface of the substrate 500 (to avoid clutter, the surface conductive traces are not shown and not all terminal pads are labelled). The ICs 502a-502d may embody, for example, signal switches, active filters, amplifiers (including one or more LNAs), and other circuitry. For example, IC 502b may incorporate one or more instances of a fuse reading circuit similar to the circuit shown in FIG. 1.

The substrate 500 may also include one or more passive devices 506 embedded in, formed on, and/or affixed to the substrate 500. While shown as generic rectangles, the passive devices 506 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 500 to other passive devices 506 and/or the individual ICs 502a-502d. The front or back surface of the substrate 500 may be used as a location for the formation of other structures.

Methods

Figure 6:
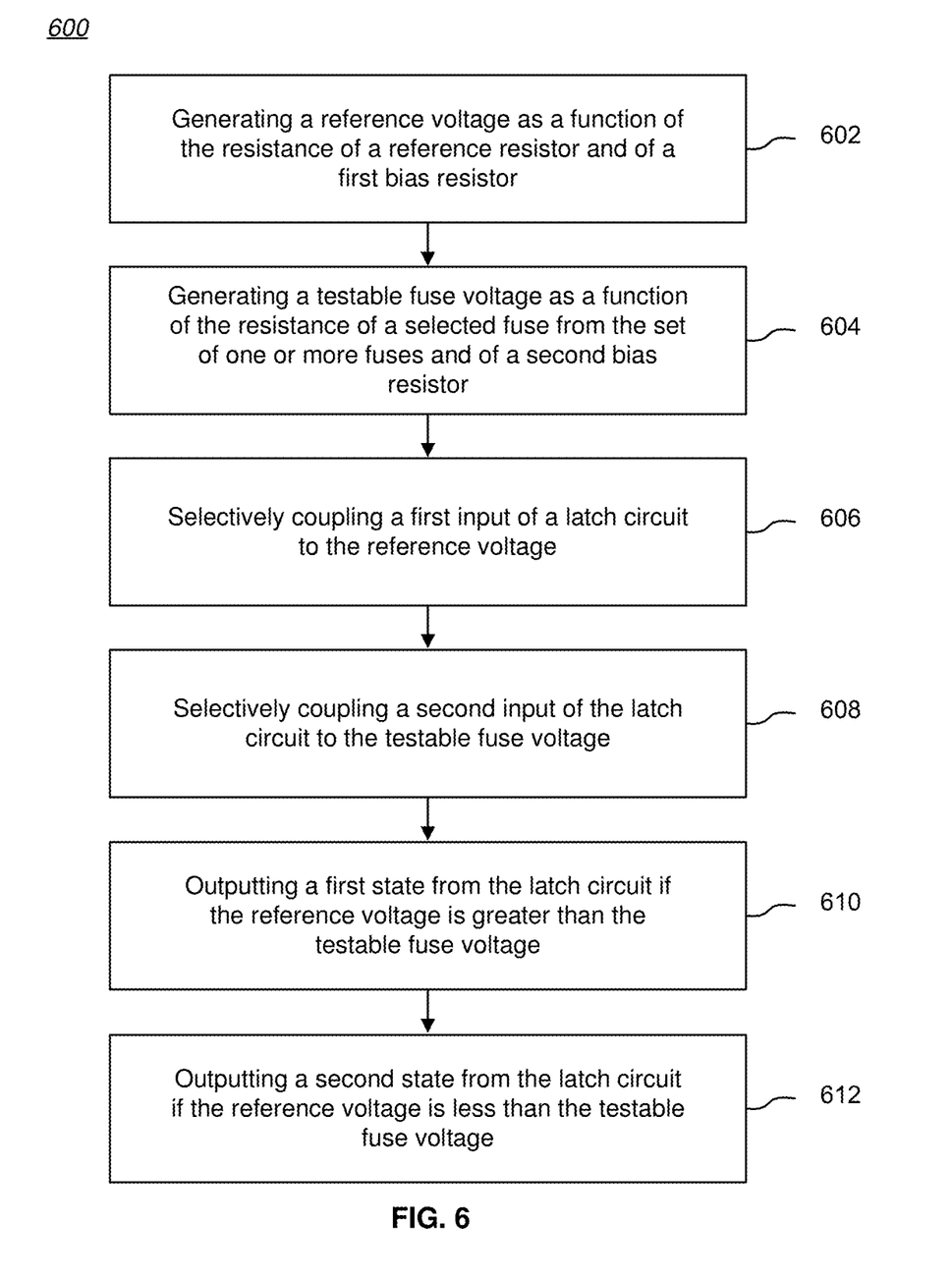
FIG. 6 is a process flow chart showing one method for method for reading a fuse.

Another aspect of the invention includes methods for reliably reading fusible links that allows use of low-voltage logic circuitry utilizing devices that may have a high-voltage stand-off capability. For example, FIG. 6 is a process flow chart 600 showing one method for method for reading a fuse. The method includes: generating a reference voltage as a function of the resistance of a reference resistor and of a first bias resistor (Block 602); generating a testable fuse voltage as a function of the resistance of a selected fuse from the set of one or more fuses and of a second bias resistor (Block 604); selectively coupling a first input of a latch circuit to the reference voltage (Block 606); selectively coupling a second input of the latch circuit to the testable fuse voltage (Block 608); outputting a first state from the latch circuit if the reference voltage is greater than the testable fuse voltage (Block 610); and outputting a second state from the latch circuit if the reference voltage is less than the testable fuse voltage (Block 612).

Additional aspects of the above method may include one or more of the following: configuring the reference resistor and the first bias resistor as a voltage divider; configuring the resistance of the selected fuse and the second bias resistor as a voltage divider; wherein the first bias resistor and the second bias resistor have variable resistance values; wherein the first bias resistor and the second bias resistor have approximately the same resistances; wherein the reference resistor has a variable resistance value; selectively enabling or disabling the latch circuit in response to a control signal; selectively coupling the first input of the latch circuit to the reference voltage through a first pass switch and selectively coupling the second input of the latch circuit to the testable fuse voltage through a second pass switch; wherein the first and second pass switches are field effect transistors having a gate, and further including coupling the gates of the field effect transistors to a control signal that enables coupling of the reference voltage and the testable fuse voltage to the respective first and second inputs of the latch circuit; coupling a charge storage capacitor at least one of the first and second inputs of the latch circuit; coupling a capacitor to the reference voltage; wherein the latch circuit includes a first and second field effect transistors having conduction channels coupled in series, each of the first and second field effect transistors having respective gates, and a third and fourth field effect transistors having conduction channels coupled in series, each of the third and fourth field effect transistors having respective gates, wherein the gates of the first and second field effect transistors are coupled to the conduction channels of the third and fourth field effect transistors, and the gates of the third and fourth field effect transistors are coupled to the conduction channels of the first and second field effect transistors; wherein the first input of the latch circuit is selectively couplable to the reference voltage through a first pass switch and the second input of the latch circuit is selectively couplable to the testable fuse voltage through a second pass switch; wherein the first and second pass switches are field effect transistors having a gate, and wherein the gates of the field effect transistors are coupled to a control signal that enables coupling of the reference voltage and the testable fuse voltage to the respective first and second inputs of the latch circuit; wherein the latch circuit includes first and second outputs each indicating the relative voltages of the reference voltage and the testable fuse voltage, and further including coupling an output validation circuit to the first and second outputs of the latch circuit and configuring the output validation circuit to validate that the first and second outputs are in complementary states.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A plurality of m fuse reading circuits, where $m \geq 2$, each fuse reading circuit including:
   (a) a set of n fuses, where $n \geq 1$;
   (b) a first circuit configured to generate a reference voltage as a function of the resistance of a reference resistor and of a first bias resistor;
   (c) a second circuit configured to generate a testable fuse voltage as a function of the resistance of a selected fuse from the set of one or more fuses and of a second bias resistor; and
   (d) a latch circuit having a first input selectively couplable to the reference voltage through a first pass switch, a second input selectively couplable to the testable fuse voltage through a second pass switch, and at least one output having a first state if the reference voltage is greater than the testable fuse voltage, and a second state if the reference voltage is less than the testable fuse voltage.

2. The plurality of m fuse reading circuits of claim 1, wherein the first and second pass switches include field effect transistors having a gate, and wherein the gates of the field effect transistors are coupled to a control signal that enables coupling of the reference voltage and the testable fuse voltage to the respective first and second inputs of the latch circuit.

3. The plurality of m fuse reading circuits of claim 1, wherein the latch circuit includes:
   (a) a first and second field effect transistors having conduction channels coupled in series, each of the first and second field effect transistors having respective gates; and
   (b) a third and fourth field effect transistors having conduction channels coupled in series, each of the third and fourth field effect transistors having respective gates; wherein the gates of the first and second field effect transistors are coupled to the conduction channels of the third and fourth field effect transistors, and the gates of the third and fourth field effect transistors are coupled to the conduction channels of the first and second field effect transistors.

4. The plurality of m fuse reading circuits of claim 1, wherein the latch circuit includes first and second outputs each indicating the relative voltages of the reference voltage and the testable fuse voltage, and further including an output validation circuit coupled to the first and second outputs of the latch circuit and configured to validate that the first and second outputs are in complementary states.

5. The plurality of m fuse reading circuits of claim 1, wherein the reference resistor and the first bias resistor are configured as a voltage divider.

6. The plurality of m fuse reading circuits of claim 1, wherein the resistance of the selected fuse and the second bias resistor are configured as a voltage divider.

7. A plurality of m fuse reading circuits, where $m \geq 2$, each fuse reading circuit including:
   (a) a set of n fuses, where $n \geq 1$;

(b) a first circuit configured to generate a reference voltage as a function of the resistance of a reference resistor and of a first bias resistor;

(c) a second circuit configured to generate a testable fuse voltage as a function of the resistance of a selected fuse from the set of one or more fuses and of a second bias resistor;

(d) a latch circuit having a first input selectively couplable to the reference voltage, a second input selectively couplable to the testable fuse voltage, and at least one output having a first state if the reference voltage is greater than the testable fuse voltage, and a second state if the reference voltage is less than the testable fuse voltage; and (e) at least one charge storage capacitor coupled to at least one of the first and second inputs of the latch circuit.

8. The plurality of m fuse reading circuits of claim 7, wherein the first input of the latch circuit is selectively couplable to the reference voltage through a first pass switch and the second input of the latch circuit is selectively couplable to the testable fuse voltage through a second pass switch.

9. The plurality of m fuse reading circuits of claim 8, wherein the first and second pass switches include field effect transistors having a gate, and wherein the gates of the field effect transistors are coupled to a control signal that enables coupling of the reference voltage and the testable fuse voltage to the respective first and second inputs of the latch circuit.

10. The plurality of m fuse reading circuits of claim 7, wherein the latch circuit includes:
   (a) a first and second field effect transistors having conduction channels coupled in series, each of the first and second field effect transistors having respective gates; and
   (b) a third and fourth field effect transistors having conduction channels coupled in series, each of the third and fourth field effect transistors having respective gates; wherein the gates of the first and second field effect transistors are coupled to the conduction channels of the third and fourth field effect transistors, and the gates of the third and fourth field effect transistors are coupled to the conduction channels of the first and second field effect transistors.

11. The plurality of m fuse reading circuits of claim 7, wherein the latch circuit includes first and second outputs each indicating the relative voltages of the reference voltage and the testable fuse voltage, and further including an output validation circuit coupled to the first and second outputs of the latch circuit and configured to validate that the first and second outputs are in complementary states.

12. The plurality of m fuse reading circuits of claim 7, wherein the reference resistor and the first bias resistor are configured as a voltage divider.

13. The plurality of m fuse reading circuits of claim 7, wherein the resistance of the selected fuse and the second bias resistor are configured as a voltage divider.

14. A plurality of m fuse reading circuits, where m≥2, each fuse reading circuit including:

(a) a set of n fuses, where n≥1;

(b) a first circuit configured to generate a reference voltage as a function of the resistance of a reference resistor and of a first bias resistor;

(c) a second circuit configured to generate a testable fuse voltage as a function of the resistance of a selected fuse from the set of one or more fuses and of a second bias resistor;

(d) a latch circuit having a first input selectively couplable to the reference voltage, a second input selectively couplable to the testable fuse voltage, and at least one output having a first state if the reference voltage is greater than the testable fuse voltage, and a second state if the reference voltage is less than the testable fuse voltage; and (e) a capacitor coupled to the reference voltage and configured to be coupled to circuit ground.

15. The plurality of m fuse reading circuits of claim 14, wherein the first input of the latch circuit is selectively couplable to the reference voltage through a first pass switch and the second input of the latch circuit is selectively couplable to the testable fuse voltage through a second pass switch.

16. The plurality of m fuse reading circuits of claim 15, wherein the first and second pass switches include field effect transistors having a gate, and wherein the gates of the field effect transistors are coupled to a control signal that enables coupling of the reference voltage and the testable fuse voltage to the respective first and second inputs of the latch circuit.

17. The plurality of m fuse reading circuits of claim 14, wherein the latch circuit includes:
   (a) a first and second field effect transistors having conduction channels coupled in series, each of the first and second field effect transistors having respective gates; and
   (b) a third and fourth field effect transistors having conduction channels coupled in series, each of the third and fourth field effect transistors having respective gates; wherein the gates of the first and second field effect transistors are coupled to the conduction channels of the third and fourth field effect transistors, and the gates of the third and fourth field effect transistors are coupled to the conduction channels of the first and second field effect transistors.

18. The plurality of m fuse reading circuits of claim 14, wherein the latch circuit includes first and second outputs each indicating the relative voltages of the reference voltage and the testable fuse voltage, and further including an output validation circuit coupled to the first and second outputs of the latch circuit and configured to validate that the first and second outputs are in complementary states.

19. The plurality of m fuse reading circuits of claim 14, wherein the reference resistor and the first bias resistor are configured as a voltage divider.

20. The plurality of m fuse reading circuits of claim 14, wherein the resistance of the selected fuse and the second bias resistor are configured as a voltage divider.

* * * * *

UNITED STATES PATENT AND TRADEMARK OFFICE
CERTIFICATE OF CORRECTION

| | | |
|---|---|---|
| PATENT NO. | : 12,313,703 B2 | Page 1 of 1 |
| APPLICATION NO. | : 18/763780 | |
| DATED | : May 27, 2025 | |
| INVENTOR(S) | : Robert Mark Englekirk | |

It is certified that error appears in the above-identified patent and that said Letters Patent is hereby corrected as shown below:

In the Specification

In the EXAMPLE EMBODIMENT:
Column 6, Line 58, change "resistors $R_{BIAS1}$ in parallel coupled" to --resistors $R_{BIAS1\_M}$ in parallel coupled--.

Signed and Sealed this
Twenty-fourth Day of June, 2025

Coke Morgan Stewart
*Acting Director of the United States Patent and Trademark Office*